US009298861B1

(12) United States Patent
Lammers

(10) Patent No.: US 9,298,861 B1
(45) Date of Patent: Mar. 29, 2016

(54) SYSTEM AND METHOD FOR DESIGNING IRRIGATION SYSTEMS

(71) Applicant: Valmont Industries, Inc., Omaha, NE (US)

(72) Inventor: Zachary M. Lammers, Elgin, IL (US)

(73) Assignee: VALMONT INDUSTRIES, INC., Omaha, NE (US)

(*) Notice: Subject to any disclaimer, the term of this patent is extended or adjusted under 35 U.S.C. 154(b) by 341 days.

(21) Appl. No.: 13/901,797

(22) Filed: May 24, 2013

Related U.S. Application Data

(60) Provisional application No. 61/651,121, filed on May 24, 2012, provisional application No. 61/730,114, filed on Nov. 27, 2012.

(51) Int. Cl.
*G06F 7/60* (2006.01)
*G06F 17/50* (2006.01)

(52) U.S. Cl.
CPC .................. *G06F 17/5009* (2013.01)

(58) Field of Classification Search
CPC ..... A01G 25/16; A01G 25/092; A01G 25/09; G01C 23/00; G06F 17/5009
USPC ............................................. 703/2, 6, 8, 9, 10
See application file for complete search history.

(56) References Cited

U.S. PATENT DOCUMENTS

| | | | | |
|---|---|---|---|---|
| 4,161,292 A * | 7/1979 | Holloway | ............. | A01G 25/092 239/11 |
| 5,947,393 A * | 9/1999 | Unruh | ................... | A01G 25/092 239/729 |
| 6,337,971 B1 * | 1/2002 | Abts | ............................... | 340/7.2 |
| 2006/0027677 A1 * | 2/2006 | Abts | ................................ | 239/67 |
| 2006/0125828 A1 * | 6/2006 | Harrison et al. | ............... | 345/441 |
| 2008/0094278 A1 * | 4/2008 | Castaneda | ............. | G01S 5/0045 342/357.64 |
| 2009/0210149 A1 * | 8/2009 | Willis | ........................... | 701/208 |
| 2010/0068299 A1 * | 3/2010 | van der Krieken et al. | ... | 424/638 |
| 2010/0306012 A1 * | 12/2010 | Zyskowski et al. | ............... | 705/8 |

OTHER PUBLICATIONS

Alves_TRANSCRIPT (Installing the Pivot System on Farming Simulator, Apr. 14, 2012, TRANSCRIPT http://www.youtube.com/watch?v=x__mq-68aAIU).*
Alves, J., How to use Pivot Irrigation System for Farming Simulator 2011, dated Apr. 14, 2012, http://www.youtube.com/watch?v=DWboYdzlFfo.*

(Continued)

*Primary Examiner* — Carlos Ortiz Rodriguez
*Assistant Examiner* — Scott S Cook
(74) *Attorney, Agent, or Firm* — David H. Milligan

(57) ABSTRACT

A computing device is described that is configured to display a graphic visualization for modeling an irrigation system, such as a center pivot irrigation system. In an implementation, the computing device includes a memory and a processor communicatively coupled to the memory. The computing device also includes one or modules stored in memory and executable by the processor. The one or more modules are configured to instruct the processor to receive a command for placing one or more representations of a center pivot irrigation system within a graphical representation of a cultivation area and to receive one or more operational parameters of the center pivot irrigation system. The one or more modules are also configured to instruct the processor to model operation of the center pivot irrigation system based upon the one or more operational parameters.

14 Claims, 4 Drawing Sheets

(56) References Cited

OTHER PUBLICATIONS

Alves, J., (Arc_Pivot) Pivot Irrigation System for Farming Simulator 2011, Mar. 24, 2012 http://www.youtube.com/watch?v=xkOzM6NFBoA.*

Alves, J., Pivot2 Mar. 25, 2012 http://www.youtube.com/watch?v=hDcl4jC1tQ0.*

Playbahnosh, Farming Simulator 2009 FAQ/Strategy Guide, Jan. 28, 2011 http://www.neoseeker.com/Games/Products/PC/farming_simulator_2009.*

Kunt, A., XML Explained, Jan. 5, 2011 http://fs-uk.com/forum/index.php?topic=60537.0.*

Canadianfarmer (Tutorial) How to get tires to leave tracks and dust through crops, Apr. 18, 2012 http://fs-uk.com/forum/index.php?topic=105988.0.*

PivotIrrigationSystemDesign_2005, Pivot Design Oregon NRCS Engineering Meeting Jan. 11-14, 2005.*

Valley_Tallcrop_2003, Tall Crop Irrigation, Valmont Irrigation, 2003.*

Lindasy_April_2010, Johnson, A., Growers can monitor irrigation via smartphone, Apr. 23, 2010 http://www.farmandranchguide.com/new/agri-tech/growers-can-monitor-irrigation-via-sm . . . .*

Linday_Dec_2011, Lindsay announces integration of FieldNET and Land.db, http://deltafarmpress.com/lindsay-announces-integration-fieldnet-land.db.*

SPRINKMOD_1998, Allen, R.G., SPRINKMOD—Simulation of Pressure and Discharge Distribution in Pressurized Irrigation Systems: Graphical Interface and Strategy of Design, Computers in Agriculture 1998: Proceedings of the 7th International Conference Oct. 26-30, 1998, Orlando, Florida.*

Pineda_Krch, M., Great-circle Distance Calculations in R, Nov. 23, 2010, http://www.r-bloggers.com/great-circle-distance-calculations-in-r/.*

\* cited by examiner

SYSTEM AND METHOD FOR DESIGNING IRRIGATION SYSTEMS

CROSS-REFERENCE TO RELATED APPLICATIONS

The present application claims the benefit under 35 U.S.C. §119(e) of U.S. Provisional Application Ser. No. 61/651,121, entitled COMPUTER PROGRAM AND METHOD FOR DESIGNING IRRIGATION SYSTEMS, filed on May 24, 2012 and U.S. Provisional Application Ser. No. 61/730,114, entitled PLACEMENT AND ANIMATION OF THREE DIMENSIONAL (3D) CONNECTED STRUCTURES ON 3D MAP, filed on Nov. 27, 2012. U.S. Provisional Application Ser. Nos. 61/651,121 and 61/730,114 are herein incorporated by reference in their entirety.

BACKGROUND

Modern day agriculture has become increasingly efficient in the past century and this trend may continue in order to produce a sufficient food supply for the increasing world population. A notable advancement in agricultural production was the introduction of mechanized irrigation systems, such as the center pivot and the linear move irrigation systems. These irrigation systems make it possible to irrigate entire fields, and reduce a crop yield's vulnerability to extreme weather conditions. The ability to monitor and to control the amount of water and/or nutrients (applicants) applied to an agricultural field has increased the amount of farmable acres in the world and increases the likelihood of a profitable crop yield. These irrigation systems typically include a control device configured to furnish a user interface allowing the operator to monitor and control one or more functions or operations of the irrigation system.

SUMMARY

A computing device is described that is configured to display a graphic visualization for modeling an irrigation system, such as a center pivot irrigation system. In an implementation, the computing device includes a memory and a processor communicatively coupled to the memory. The computing device also includes one or modules stored in memory and executable by the processor. The one or more modules are configured to instruct the processor to receive a command for placing one or more representations of a center pivot irrigation system within a graphical representation of a cultivation area and to receive one or more operational parameters of the center pivot irrigation system. The one or more modules are also configured to instruct the processor to model operation of the center pivot irrigation system based upon the one or more operational parameters.

This Summary is provided solely to introduce subject matter that is fully described in the Detailed Description and Drawings. Accordingly, the Summary should not be considered to describe essential features nor be used to determine scope of the claims.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

FIGS. 3 through 6E illustrate example modeling views in accordance with example implementations of the present disclosure.

DETAILED DESCRIPTION

Figure 1:
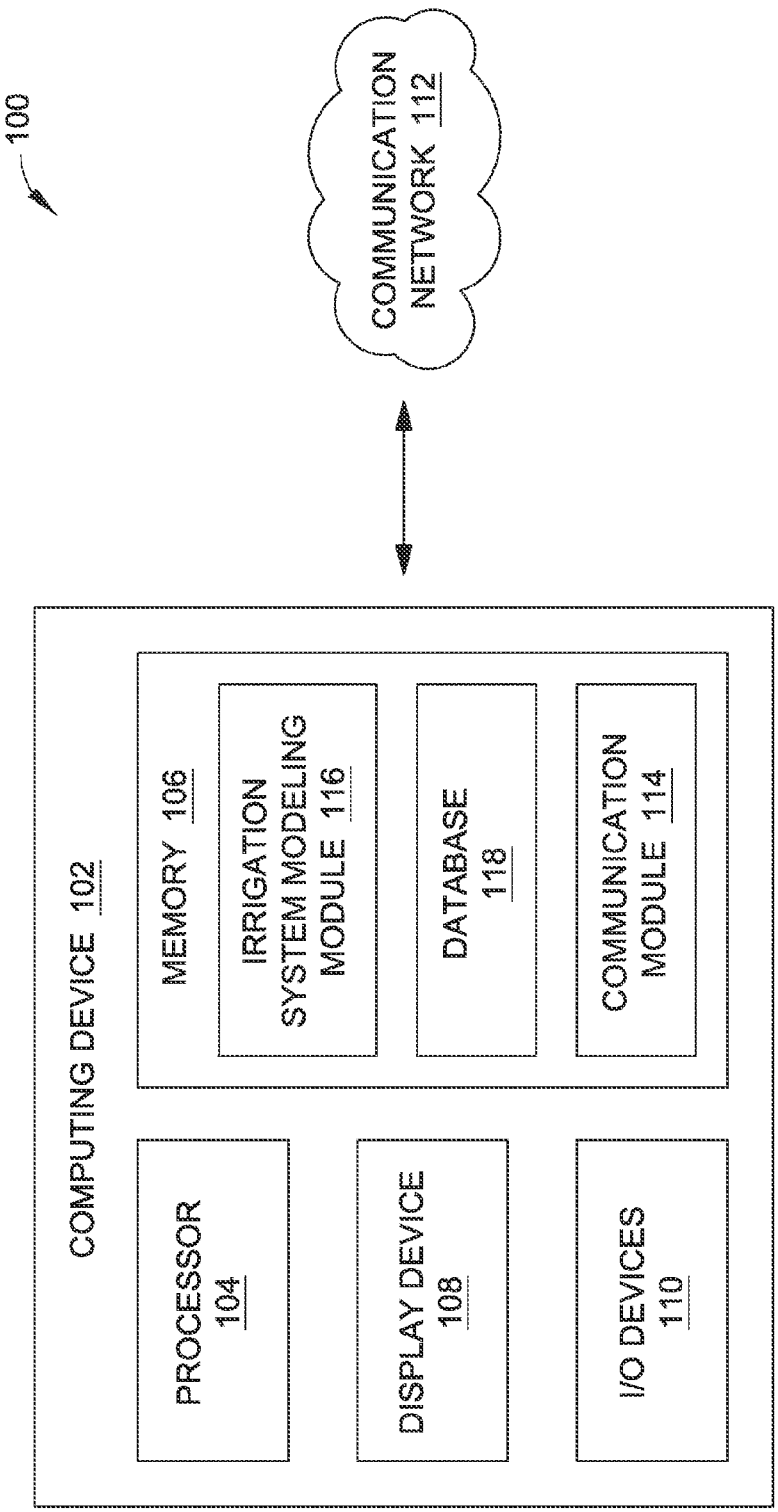
FIG. 1 is a block diagram of a system in accordance with example implementations of the present disclosure.

FIG. 1 illustrates a system 100 for modeling operation of an irrigation system. As shown, the system 100 includes a computing device 102 configured to model operation of an irrigation system, such as a center pivot irrigation system, based upon one or more operational parameters. In one or more implementations, the computing device 102 may be a server computing device, a desktop computing device, a laptop computing device, or the like. As shown in FIG. 1, the computing device 102 includes a processor 104 and a memory 106.

The processor 104 provides processing functionality for the computing device 102 and may include any number of processors, micro-controllers, or other processing systems and resident or external memory for storing data and other information accessed or generated by the computing device 102. The processor 104 may execute one or more software programs (e.g., modules) that implement techniques described herein.

The memory 106 is an example of tangible computer-readable media that provides storage functionality to store various data associated with the operation of the computing device 102, such as the software program and code segments mentioned above, or other data to instruct the processor 104 and other elements of the computing device 102 to perform the steps described herein.

The computing device 102 is also communicatively coupled to a display 108 to display information to a user of the computing device 102. In embodiments, the display 108 may comprise an LCD (Liquid Crystal Diode) display, a TFT (Thin Film Transistor) LCD display, an LEP (Light Emitting Polymer) or PLED (Polymer Light Emitting Diode) display, and so forth, configured to display text and/or graphical information such as a graphical user interface. For example, the display 108 displays visual output to the user. The visual output may include graphics, text, icons, video, interactive fields configured to receive input from a user, and any combination thereof (collectively termed "graphics").

As shown in FIG. 1, the computing device 102 is also communicatively coupled to one or more input/output (I/O) devices 110 (e.g., a keyboard, buttons, a wireless input device, a thumbwheel input device, a trackstick input device, a touchscreen, and so on). The I/O devices 110 may also include one or more audio I/O devices, such as a microphone, speakers, and so on.

The computing device 102 is configured to communicate with one or more other computing devices over a communication network 112 through a communication module 114. The communication module 114 may be representative of a variety of communication components and functionality, including, but not limited to: one or more antennas; a browser; a transmitter and/or receiver (e.g., radio frequency circuitry); a wireless radio; data ports; software interfaces and drivers; networking interfaces; data processing components; and so forth.

The communication network 112 may comprise a variety of different types of networks and connections that are contemplated, including, but not limited to: the Internet; an intranet; a satellite network; a cellular network; a mobile data network; wired and/or wireless connections; and so forth.

Wireless networks may comprise any of a plurality of communications standards, protocols and technologies, including, but not limited to: Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11 g and/or IEEE 802.11n), voice over Internet Protocol (VoIP), Wi-MAX, a protocol for email (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), and/or Instant Messaging and Presence Service (IMPS), and/or Short Message Service (SMS)), or any other suitable communication protocol.

Figure 2:
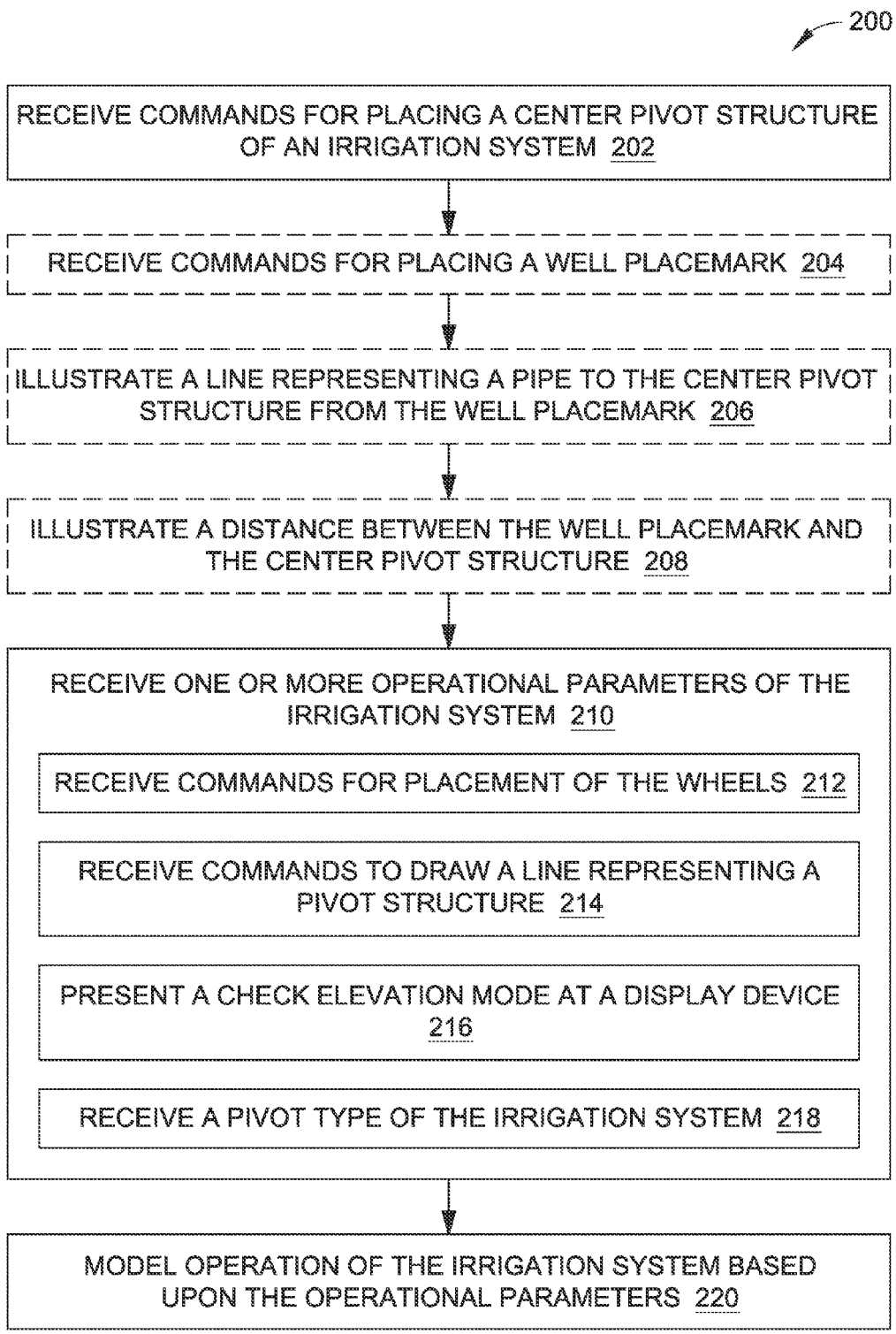
FIG. 2 is a flow diagram illustrating an example method for modeling an operation of an irrigation system in accordance with an example implementation of the present disclosure.

The computing device 102 includes an irrigation system modeling module 116, which is storable in memory 106 and executable by the processor 104. The irrigation system modeling module 116 is representative of functionality to receive commands representing a design and placement of an irrigation system within a graphical representation of a map. As shown in FIG. 2, the module 116 is configured to present a graphical representation 200 of a map representing a cultivation area, such as a field, at a display 108. The user may input one or more inputs through one or more I/O devices 110 to cause the module 116 to instruct the processor 104 to design and to place a center pivot irrigation system (also referred to herein as "center pivot" or simply "pivot") within a geographically representative map without surveying the land prior to use of the system 100. In other words, the user can place a pivot at any location represented within the graphical representation (i.e., graphical representation of the globe), and is not restricted in any way for center pivot location. The system 100 is also not limited to a manufacturer, which allows for a customizable color scheme and manufacturer logo.

FIG. 2 illustrates an example method 200 for placing and designing an irrigation system (e.g., a center pivot irrigation system). As shown in FIG. 2, commands for placing a center pivot structure are received (Block 202). In one or more implementations, the processor 104 is configured to receive one or more commands for placing a center pivot structure within a graphical representation of a physical cultivation area (e.g., a field). The commands may represent position parameters corresponding to a physical location within the cultivation area.

In an example implementation of the present disclosure, commands for placing a well placemark are received (Block 204). In one or more implementations, the user can input commands (e.g., position parameters) to place a well placemark that is configured to provide fluid (i.e., water, applicant) to the irrigation system. Once the well placemark is positioned, a line representing a pipe for furnishing the fluid to the center pivot structure is illustrated (Block 206). In some implementations, the distance between the well and the center pivot structure is illustrated (Block 208). For example, text proximate to the well placemark may be displayed that indicates the distance between the position of the well and the position of the center pivot structure.

One or more operational parameters of the irrigation system are received (Block 210). For example, as described herein, one or more operational parameters of the irrigation system (e.g., the center pivot irrigation system) are received by way of an I/O device 110. In accordance with an example implementation of the present disclosure, one or more customizable options may be presented to the user for placing one or more structures of the irrigation system. As shown in FIG. 2, commands for placement of the wheels are received (Block 212). In one or more implementations, a latitude and longitude point is found by using the current span distance and the haversine formula (see Table 1) for geospatial distance.

TABLE 1

Haversine Distance:

Formula:
$a = \sin^2(\Delta\phi/2) + \cos(\phi_1)*\cos(\phi_2)*\sin^2(\Delta\lambda/2)$
$c = 2*\text{atan2}(\sqrt{a}, \sqrt{(1-a)})$
$d = R*c$
$\phi$ represents latitude, $\lambda$ represents longitude, R represents earth's radius (e.g., mean radius = 6,371 km).
For the purposes of the present disclosure, the function "atan2" represents an arctangent function with two arguments, used to determine a particular quadrant for an angle computed with the arctangent function.
Code [Javascript]:
```
var R = 6371; // km
var dLat = (lat2-lat1).toRad( );
var dLon = (lon2-lon1).toRad( );
var lat1 = lat1.toRad( );
var lat2 = lat2.toRad( );
var a = Math.sin(dLat/2) * Math.sin(dLat/2) +
    Math.sin(dLon/2) * Math.sin(dLon/2) *
    Math.cos(lat1) * Math.cos(lat2);
var c = 2 * Math.atan2(Math.sqrt(a), Math.sqrt(1-a));
var d = R * c;
```

Once a point is determined (found) for one span, the bearing is changed (i.e., incremented through degrees in a circle), and the next point for the next span is determined (found). When all points for a specific span are found, the points are used to draw a line within the map. This line represents one wheel line, or a representation of a wheel track. Then the span is changed (incremented) to the next span length, and the process repeats until all wheel tracks for each of the spans are drawn. This is also repeated for overhang length and spray length, each with slightly different colors, or hues, to show difference from the wheels.

Additionally, the user may place one or more arbitrary number of ruler points using the device 110 that allows for the measurements of distance and elevation change between points defined by the ruler points. A user can enter an address to zoom to, and jump back to previously entered addresses. In addition, shortcut buttons exist to zoom the current view to either 90 or 45 degrees.

As shown in FIG. 2, commands are received to draw a line representing a pivot structure (Block 214), such as an irrigation span. For example, a user can utilize a device 110 to draw a line that represents a pivot at a number of points (e.g., 'fills out' the wheel pivot, allowing coverage view easier, and allowing for pivot 'play' described below). For example, line pivots are drawn by using a modified function of the wheel lines. In this case, each bearing is used as one line, and the processor 104 utilizes the haversine formula to calculate the latitude and the longitudinal points. Once all points are found for a specific bearing, it is drawn on the map (graphical representation) and the process repeats at the next bearing. Lines are drawn at a specific height above the ground, representing the minimum clearance height of the pivot in that span.

Discernible lines are illustrated to indicate that a crop height may exceed an irrigation span clearance. For example, the module 116 is configured to cause the processor 104 to draw orange lines (e.g., warning images) at a specified height and are modifiable per span. These lines are utilized to illustrate any areas where crop height may exceed span clearance. Warning and critical lines are drawn with the same function, very similar to the line drawing, except the haversine formula is used to calculate multiple sub-span latitude and longitude points between each span (for example, with a sub-span check count of 5, with 180 foot spans, finds latitude and longitude of 180/5=36 foot distances). At each sub-span distance, the altitude of the ground is found, and a line is drawn at either the warning or critical heights (default of 9 and 7 feet). This is used to visually represent a 9 or 7 foot 'floor' where the tops of crops may be. Providing more checks per span makes this more accurate. If this line ever exceeds the height of the 'Line' pivot, seen visually, there is an issue with span clearance of any type of elevation rise between wheel tracks. Additionally, the processor 104 may be configured to draw red lines at a specified height that is modifiable per span to indicate any areas where crop height likely exceeds span clearance.

A check elevation mode may presented at a display device (Block 216). For example, a check elevation mode may be entered via click-and-check option where problem areas are highlighted on a map. For example, the mode may determine critical and height settings per span and present areas where problems may occur. Elevation checks differ from warning and critical line checks by only drawing warning and critical lines where issues may exist. In this case, the same algorithm is used to find the latitude and longitude of every sub-span distance between every span at all given bearings. However, an additional step is taken to determine the height of the pivot span itself at that sub-span point. This is done by finding the altitude of the pivot at the given bearing, at both the start and end of the span (at each wheel track point), and then calculating the slope (see Table 10) of the pivot. Once the slope of the pivot is found, it can be used to find the altitude of the span at any given sub-span distance. If the height of span is less than the height of the sub-span check plus the warning or critical height for that span, the location of that point is saved in an array for that bearing. At the end of all checks along that span and bearing, warning and critical lines are drawn on the map where those issues exist.

A pivot type of the irrigation system is received (Block 218). For example, the module 116 is configured to receive command indicating whether the irrigation system is a regular (e.g., traditional) full circle pivot (e.g., 360 degrees of rotation) or an arc (e.g., part-circle) pivot. If the irrigation system is an arc pivot, commands are received indicating a specified start and stop bearing (either manually entered or by dropping placemark pins on map to draw to/from). Arc pivots are drawn only between the start and stop bearing specified by the user. When placing an arc pivot, the user may be presented the option to select a 'Bend' pivot. Selecting this option opens new options under each section. Bend pivots act as a new center point and once the bend pivots reached the limit of the previous arc's bearing limits. Each span which is not the last span can have its own bending span, allowing from 0 to 180 degrees of bend.

The irrigation system is modeled based upon the received operational parameters (Block 220). As described in greater detail herein, the module 116 is configured to cause the processor 104 to model the irrigation system is modeled based upon the operational parameters. Bending pivots may be drawn as a 'new' arc pivot, starting at the wheel span under which the bending angles are specified. A bend begins when the previous pivot stops—such as the arc start/stop bearings. A bend can happen both clockwise and counterclockwise directions, and have different values for each on the same span. A bend is calculated given the last latitude and longitude point of the bending span, and the number of degrees of bend. The latitude and longitude of the bending span acts as a new pivot point for a arc pivot of less span length (current spans-bending span point spans), basically drawing a smaller arc pivot connected to a larger arc pivot, at each start/stop point of the previous arc.

A user can elect to load (from the database 118) any nearby wheel tracks also created by that user's dealer, editable by distance. These wheel tracks can be utilized as if the user loaded that pivot, showing arc, corner, and bender pivots wheel tracks as well as overhang and water gun spray coverage. This is accomplished by performing spatial queries against the database 118, finding center points of pivots within a certain distance of the center point of the pivot currently selected. Once all are found, the database 118 and computing device 102 return a list of pivots and associated data required to draw wheel tines to the application, which then draws lines representing the wheel tracks, overhang area, and spray area of each nearby pivot. This uses functions similar to initial wheel lines, but loading specifically from the data returned instead of the text box configuration data of the currently selected pivot.

In some implementations of the present disclosure, at any time after a pivot is initially placed or loaded, a user may elect to 'Clear and Create New' that removes any previously drawn pivots and nearby wheel tracks, and clear any well or ruler placemarks and lines on the map, putting the application in a 'ready' state to design and place a new pivot. There is also a 'Redraw Pivot' button causing a full redraw of the pivot that uses all current settings, including those changed since the last draw of the pivot.

Irrigation structures, or sections, can be added/removed by simple '+' and '−' graphical buttons. Each span has a fully customizable length (span length), height (minimum span height showing maximum clearance on a flat terrain), warning height (where orange lines would be drawn) and critical height (where red lines are drawn). Also included is a field to enter a number of elevation samples per span to calculate for warning and critical heights. As the number increases, the sample size increases and a higher accuracy at the cost of taking longer to draw the warning and critical pivot checks.

The visible portion of span data by default is the length. An 'Advanced' button shows all the rest of the customizable options. There is also a 'Detail button, which shows calculations per span, current span length total (from center), and total acreage under this and all preceding spans).

Any pivot can be 'converted' into a corner pivot, A corner pivot allows for one swing arm, where it swings out in the corners (normally NE, SE, SW, NW) corners of a square field to increase irrigation coverage.

When Selecting 'Corner?', a user can choose a span length, set minimum, warning, and critical heights, and checks per that corner span, as in a regular section. In addition, the user can specify how many feet inside the bounds the overhang may remain (if the bounds were a fence line with electrical poles, to keep the overhang away from the electrical lines).

The user may input commands at an I/O device 110 to generate customizable bounds (e.g., the user guesses the bounds) that creates a border box around the pivot. The user can also specify any number of bounds points, for instance, to trace out buildings within the graphical representation of the property where the corner swing arm cannot be extended. The bounds corner points can be moved simply by dragging them.

When bounds are complete, 'Trailing' or 'Inverted' can be chosen to determine corner swing arm placements at every degree. Corner placement is determined (e.g., guessed) by first creating a polygon with the bouding box latitude and longitude placements, then automatically placing the swing arm at a fixed angle (editable) of 10 degrees off the pivot span. If the end of the overhang is not within the bounding polygon, the corner bearing is incremented by one (11, 12, etc) and the latitude and longitude of the end of the swing aim and overhang are recalculated, and checked again against the bounding polygon. This continues until the swing arm either fits within the bounding polygon, or 180 degrees (would be physically impossible to go further). If the swing arm does not fit, the module 116 is configured to cause the processor 106 draw the swing arm at 10 degrees.

After guessing, each guessed corner location can be edited by simply dragging the swing arm (limited by its length) to a new angle. Swing arms may follow the new bearing created by dragging the arm, at the length listed in the corner length text box. These points are saved with the pivot. These placemarks can be shown or hidden in the menu via the 'Show/Hide SDU Pins' buttons.

When complete with the corner placement, clicking 'Finalize' replaces the current wheel lines for the overhang and water spray, add the corner swing arm wheel line, and recalculate wheel lines for the overhang and water spray, based off current bearing of swing arm and current bearing of spray, and whether the spray is on or off at that given bearing.

When finalizing, the current position of the corner and overhang (in latitude and longitude coordinates), are used to calculate the corner swing arm wheel track and the overhang 'track', as well as the spray point track, provided spray is 'on' at the given coordinates compared to the bearing from the center point of the pivot.

Regardless of pivot type and corner selection, a user has options for overhang length and water spray distance. The overhang also has options for minimum, warning, and critical heights along with checks to perform for the overhang. The water distance is the distance the gun at the end of the overhang can spray water. Both overhang and water distance have detail boxes including total span length, running acreage total, and acreage under the overhang or spray.

The applicant dispersal device (i.e., end gun or the like) of the overhang can also be turned 'off' and 'on' at specific bearings. In some implementations, this option is at the cardinal directions (e.g., a square field) where the corners would have the water gun on and the edges would not. As these are the most common areas of non-spray, the graphical representations have separate 'N', 'S', 'E', 'W' buttons, and selecting each allows the user to enter bearings to turn off the water gun. In addition to the cardinal directions, the user can also select '−' and '+' to add additional sections where the water gun may or may not be on. When spray is drawn, each bearing is checked against the listed on/off sections, and if within an 'off' section, the spray is not represented within the graphical representation.

When in 'Advanced' mode, a user can set defaults across all sections (spans)—the options to set are the default length of a span, minimum (default) height, and critical and warning heights, as well as the elevation checks per span. Setting any of these values causes all sections to update their values to the new default.

After a 'line' pivot is placed, a user can play or step through that pivot. When playing the pivot, the pivot moves around the center point in the direction specified via the 'Clockwise' or 'Counter CW' buttons. The speed of the pivot playing can be increased or decreased as desired, and it can be paused at any time. In addition to playing, the user can 'step' the pivot one step at a time in either direction, or take multiple steps of ⅒ of the pivot at a time, also in either direction.

Playing a pivot is accomplished by taking the 'line' (and warning and critical) drawing of all bearings, hiding all lines, and displaying only one 'line' at a time, then hiding that line and moving on to the next (or previous). Playing a pivot can also happen programmatically (while playing, instead of before), where each bearing is chosen from the previous, and new latitude and longitudes are calculated for all points of all wheels using the haversine formula, and the lines are edited to use the new latitude and longitude points.

In an implementation, a user can choose to view terrain in an exaggerated fashion, up to exaggerating at three times the normal terrain. These exaggerated modes assist in pointing out issue spots with elevation, especially with warning and/or critical pivot lines drawn, as the issues spots stand out more prominently. However, basic elevation checking is unaffected by terrain exaggeration and show the same areas.

Once a pivot is placed, and all settings (including corner, bend, and arc, as well as ruler and well placements) are finalized, a user can give a name and a description to the pivot, and save it. When saving, a status for the pivot can be selected, and each status has a specific color when initially displayed on the map. The pivot then appears in a list on the right of the screen, sorted alphabetically by name. If a pivot is selected in that list, it is automatically zoomed to and loaded. At this time, the pivot may also be deleted from the system.

The save list is searchable by name and description. Every pivot in the save list contributes to a dealer's full view—a 'zoom out' button causes the map view to zoom out to encompass all currently saved pivots. Selecting a status in searching also limits a pivot to those specific colors as well.

A pivot is saved in a combination of text name and description data, along with numeric span lengths, heights, and center and corner placement latitude and longitudes. Pivot bounds are saved in latitude and longitude points, Both Well and Ruler placements are saved with the pivot, in simple latitude and longitude points, and redrawn when loaded.

Once the user is satisfied with the design and placement of a pivot, selecting Print' opens a new window displaying the wheel tracks, overhang, and spray lines from a top-down perspective, with data on the pivot listed on the left per span, including running span, acreage, and acreage per span. The print option will also display the manufacturer logo prominently, which is customizable per dealer. Printing a pivot uses the same algorithm as drawing wheel tracks on a map.

In an example implementation of the system 100, in order to place a connected series of models (i.e., representations of center pivot irrigation structures) within an orthographic (3D) map, it may be necessary to start at one end and place the models sequentially up to the opposite end. On a flat surface, with no elevation change or slope, placing one model after the other is easier, requiring only simple calculations with the Destination Given Distance and Bearing formula (see Table 2), with the initial point's latitude and longitude.

TABLE 2

Destination Given Distance and Bearing:

Formula:
$\phi_2 = \operatorname{asin}(\sin(\phi_1)*\cos(d/R) + \cos(\phi_1)*\sin(d/R)*\cos(\theta))$
$\lambda_2 = \lambda_1 + \operatorname{atan2}(\sin(\theta)*\sin(d/R)*\cos(\phi_1), \cos(d/R) - \sin(\phi_1)*\sin(\phi_2))$
$\phi$ represents latitude, $\lambda$ represents longitude, $\theta$ represents the bearing (in radians, clockwise from north), d represents the distance travelled, R represents the earth's radius (d/R represents the angular distance, in radians).

TABLE 2-continued

Destination Given Distance and Bearing:

Code [Javascript]:
var lat2 = Math.asin(
Math.sin(lat1)*Math.cos(d/R) +
Math.cos(lat1)*Math.sin(d/R)*Math.cos(brng));
var lon2 = lon1 +
Math.atan2(Math.sin(brng)*Math.sin(d/R)*Math.cos(lat1),
            Math.cos(d/R)-Math.sin(lat1)*Math.sin(lat2));

In this case, find the bearing one wishes the model to follow, and the length of each desired section of the model. The first model is anchored at the start latitude and longitude, and 'pointed' in the bearing direction. The desired length of the model is then used in formula (Table 3) to find the latitude and longitude of the end of the model. This latitude and longitude are then used as the starting latitude and longitude of the next model, keeping with the given bearing, until the end of the connected model is reached.

TABLE 3

Pythagoras:

Formula:
$d = \sqrt{L^2 - (a_1 - a_0)^2}$
$c = f_2(b, d)$
L represents horizontal distance, $a_1$ represents an initial altitude, $a_2$ represents a final altitude, $f_2$ represents a function call to the function described in Table 2 described above with bearing b and distance d, where the function described in Table 2 returns latitude/longitude pair c.
Code [Javascript]:
var d = Math.sqrt( Math.pow(L,2) - Math.pow((a1-a0),2));

However, it is not common for zero elevation change and slope over the course of where the desired placement of the model exists. In this case, more calculations are needed to appropriately place a model in the given bearing, in order to follow the terrain. These formulas are the Pythagoras (see Table 3), Rotating Slope (see Table 4), and Rotating Bearing (see Tables 5 and 6) formulas. There are a couple of reasons for this. First, as elevation changes over distance, the calculated distance via formulas (see Table 1 and Table 2) only take flat terrain into consideration, and cannot judge distance over elevation-changing terrain. Second, as a model is placed on non-flat terrain, portions of that model may need to slope with that terrain, instead of being perfectly level. In this case, the portions of the model that slope with the terrain cause the midpoint of that model to be skewed by a number of degrees, causing the alignment of the model to be off.

TABLE 4

Rotating Slope:

Formula:
$t = \arccos((\Delta a)/p)$
where p represents a positive sampling distance, $\Delta a = (a_1 - a_0)$ with a1 represents initial altitude at model midpoint, $a_o$ represents a sample point altitude. For example, in the case of center pivot irrigation, p generally represents either span length or one-half (½) a wheel width.
Code [Javascript]:
var s = (a1 − a0) / p; //slope
var t = Math.acos(s).toDeg( )%360; //arccos(slope) in degrees

TABLE 5

Rotating Bearing:

Formula:
$m = (\Delta a) / p$
$\lambda = h*\tan(\text{atan}(m))$
$\phi = \lambda*\cos(\text{atan}(m))$
$c = f_2(b + -180, |\phi|)$
where m represents a slope of the rotated model, p represents one-half (½) of the rotated model width, h represents the rotated model height, $\lambda$ represents the ground distance from the rotated model center to the new rotated model center, $\phi$ represents the altitude difference between the midpoint of the rotated model and the new rotated model midpoint, b represents the model bearing modified by 180 degrees if necessary to tilt in another direction, and $f_2$ represents a function call to the function described in Table 2.
Code [Javascript]:
var m = (a1-a0) / p;
var lambda = h * Math.tan(Math.atan(m)); var phi = lambda * Math. co s (Math. atan(m)); f2(bearing+modification, Math. abs(phi));

TABLE 6

"Rotating Bearing" (FIGS. 6A through 6E)

$\theta + 1 = 90°$
$\theta = \Delta a / p_x$
$\lambda = h*\tan(\arctan(m))$
$\phi = \lambda*\cos(\arctan(m))$
where $p_x$ represents sample distance.

TABLE 7

Great Circle Bearing:

Formula:
$\theta = \text{atan2}(\sin(\Delta\lambda)*\cos(\phi_2), \cos(\phi_1)*\sin(\phi_2) - \sin(\phi_1)*\cos(\phi_2)*\cos(\Delta\lambda)$
Code [Javascript]:
var y = Math.sin(dLon) * Math.cos(lat2);
var x = Math.cos(lat1)*Math.sin(lat2) − Math.sin(lat1)*Math.cos(lat2)*Math.cos(dLon);var brng = Math.atan2(y, x).toDeg( )

In the case of non-flat terrain with sloped models, several steps may be taken. First, using a derivation of the Pythagorean theorem (see Table 3), calculate the 'terrain shrink' (see below) that exists as the model is not placed purely horizontally but on a sloped surface (causing the pure horizontal distance to be lesser). This is the tilt of the model, 'up' or 'down' from its initial altitude to its final altitude. This could also be called the 'pitch' of the model. The latitude and longitude are then recalculated with the new sloped horizontal distance via the Destination Given Distance and Bearing (see Table 2) formula (for the second time), as the next model in the series may then use that new latitude and longitude pair to continue an unbroken chained model.

TABLE 8

Figure 3:
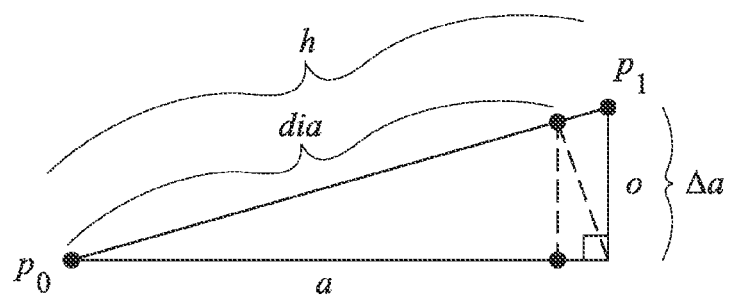

"Terrain Shrink" (see FIG. 3)

$a^2 + o^2 = h^2$
$a^2 = h^2 - o^2$
$a = \sqrt{(h^2 - o^2)}$

Figure 4:
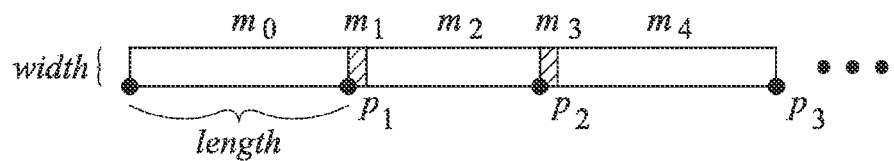

In addition, for each model portion in the chain that will be following the slope of the terrain (not just the 'pitch' as in the previous paragraph, but also the 'roll'), one may calculate the slope of each model portion to be sloped via the Rotating Slope (see Table 4) formula, and once complete, the model immediately prior may be 're-pointed' towards the new coordinates and altitude of the sloped model, or the chained model alignment (see FIG. 4) will be off. To perform this, the prior model may have a new bearing calculated by the Rotating Bearing (see Tables 5 and 6) formula. Then, both the rotated model and prior model may be repositioned to reflect the new pitch and roll settings. In the case of the prior model, it will have a new bearing (yaw), and pitch to point towards a different latitude and longitude and altitude (see below for Slope/Pitch). In the case of the sloped model, it will have a new roll, along with the prior settings if necessary for the next model in the chain, until the end of the chained series is reached.

TABLE 9

Figure 5A:
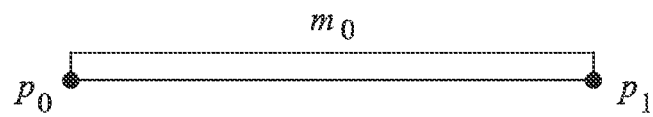
Figure 5B:
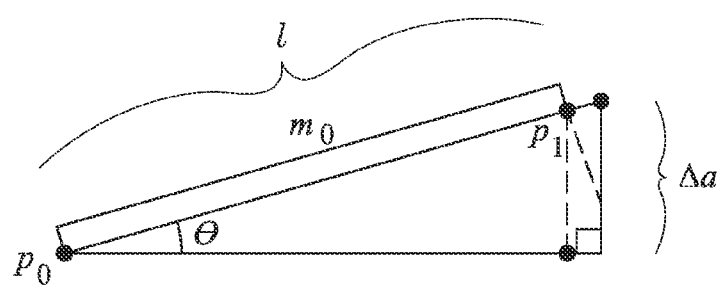
Figure 6E:
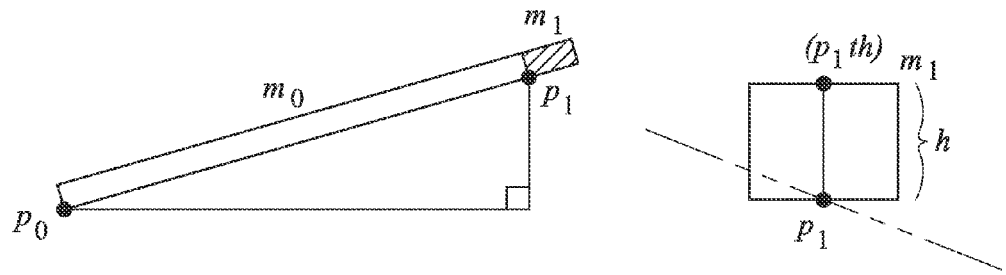
Figure 6E:
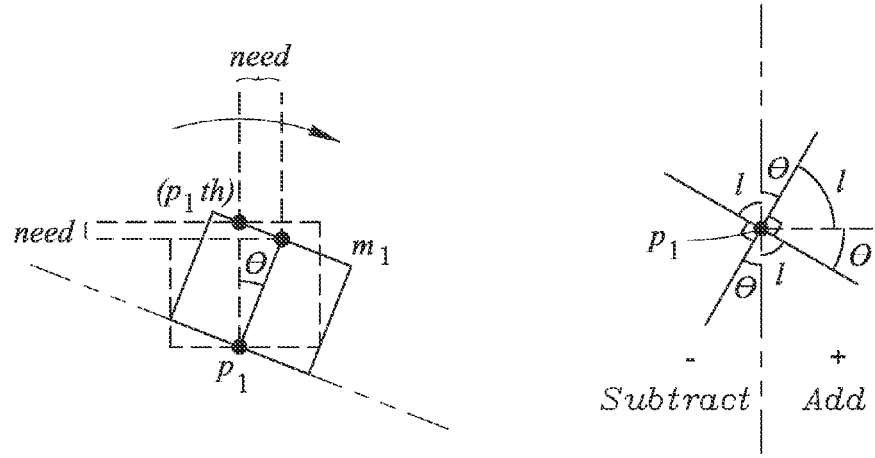
Figure 6E:
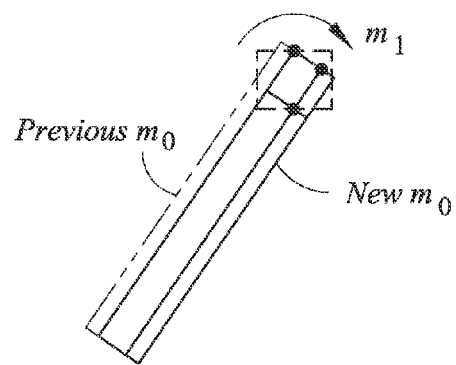

"Slope/Pitch" (FIGS. 5A and 5B)

$\theta = \arccos(\Delta a/l)$
$\theta = \arccos((a_0 - a_1)/l)$
where l represents the length of $m_o$.

TABLE 10

Slope Formula $M = (y1 - y2)/(x1 - x2)$
where y1 and y2 represent elevations of a span, x1 and x2 represent the distance within the span, and $y = m^*x + c$ is utilized to determine an altitude at a new 'x' + c modifier.

An example chained model using the above formulas could be a center pivot irrigation system. In the case of a center pivot irrigation system, each span may be tilted to the correct pitch and bearing (yaw). This is done via the Pythagoras formula (see Table 3) and Rotating Slope formula (see Table 4). After properly placing the span model with the correct pitch and bearing, then the wheel section may be placed. The chained wheel model may be tilted (roll) with the slope of the terrain at that latitude and longitude. However, in doing so, the apex of the wheel model will change both altitude and latitude and longitude. When rolling the wheel model using the Rotating Slope formula (see Table 4), then use the Rotating Bearing formula (see Tables 5 and 6) to calculate the new latitude/longitude and altitude for the previous span (the span closer to the center of the pivot from the current wheel model). This latitude/longitude pair is then used as the new starting point for the next span, continuing out until the end of the chained model (the irrigation system) is reached.

It is also possible to create bounds for the entire chained model, and keep portions or all of the chained model within those bounds. To do so, first create a polygon that surrounds the area that the chained model may stay within, and if the specified areas of the model do not fit within the model, edit multiple variables until the chained model fits within the bounds. These variables can be the initial bearing, the initial latitude/longitude pair, or even a specific bearing of a specific portion of the chained model. An applicable case here is what is commonly referred to as a corner pivot, where the last span/wheel model/and overhang model of a center pivot irrigation system can 'bend' at [generally] the second to last wheel set (model), allowing it to extend into corners of the bounded polygon, and folding 'inward' (towards a 90 degree bend) at areas where the bounds are less, to fit a longer center pivot irrigation system in an area that would not normally support that length.

In addition to keeping all or specific portions of a chained model within a bounded polygon, it is also possible to bend specific sections of a chained model up to specific degrees (up to one hundred and eighty (180) degrees, at which point any chained model would bend back into itself). To do so, recursively perform the above formulas/calculations until the last section is reached for each 'bent' section. These bending sections merely change the initial bearing and initial latitude/longitude pair of the model, making the remainder of the model act as if the initial bearing and latitude/longitude pair are the set used at the start of the bending section. This is then repeated in a recursive fashion until all possible values of bending, bearing, and latitude/longitude pairs are exhausted, and the end of the chained model is reached.

Taking all of the above into account, it is also possible to animate movement of the chained structure across terrain. To do so, the above functions are calculated on two editable variables. The first is the bearing: the entire chained model can rotate around a specific initial latitude and longitude that has a changing bearing, in both clockwise and counterclockwise directions. An example of this would be a center pivot irrigation system. The second variable is the latitude and longitude itself: keeping a fixed bearing, editing the initial latitude and longitude pair of the model will create the chained model in the direction the initial latitude/longitude pair is moving. An example of this would be a linear irrigation system. Finally, both variables could be edited at the same time, with both bearing and the initial latitude/longitude pair changing on each iteration of placement of the chained model.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A computing device comprising:
   a memory operable to store one or more modules; and a processor coupled to the memory, and a display device coupled to the processor, and an I/O device coupled to the processor, the processor operable to execute the one or more modules to:
   receive a command from the IO device for placing a representation of a first center pivot irrigation system having a plurality of spans within a graphical representation displayed on the display device of a cultivation area having a modeled terrain;
   receive a representation of at least one wheel of the first center pivot irrigation system from the IO device and to utilize the haversine distance formula to determine a representation of a wheel track of the at least one wheel;
   determine and model the longitude, latitude and altitude of a connection point connecting a first modeled span of the first center pivot irrigation system to a second modeled span of the irrigation system;
   receive from the IO device a first parameter of the first center pivot irrigation system comprising the longitude and latitude of the first center pivot irrigation system within the cultivation area;
   receive from the IO device a second parameter of the first center pivot irrigation system comprising the length (d) of a first modeled span to be connected to the first center pivot irrigation system, wherein the length (d) is determined using the formula $d=d=\sqrt{(L^2-(a_1-a_0)^2)}$ where L is the determined horizontal distance to be covered by the first modeled span, $a_1$ is an initial altitude and $a_0$ is a final altitude over the length L within the modeled terrain;

receive from the IO device a third parameter of the first center pivot irrigation system comprising a rotating slope of the modeled terrain along a rotated path of the first modeled span;

receive from the IO device a fourth parameter of the first center pivot irrigation system comprising a first bearing; and receive from the IO device a fifth parameter of the first center pivot irrigation system comprising an adjusted bearing, wherein the adjusted bearing is determined based on the first bearing and a determined change of altitude over a sampled length of the modeled terrain;

model operation of the center pivot irrigation system based upon the one or more parameters by repeatedly incrementing the bearing through a plurality of degrees in a circle and finding a plurality of points of the span until a resulting model of the center pivot irrigation system is obtained for the wheel tracks and overhang length and spray length for each of the spans;

display the resulting model of the first center pivot irrigation system with colored lines on the modeled terrain with the display device representing the wheel track of the at least one wheel in a first color and the overhang length in a second color and spray length in a third color.

2. The computing device as recited in claim 1, wherein the one or more modules are configured to cause the processor to receive a pivot type input of the first center pivot irrigation system.

3. The computing device as recited in claim 2, wherein the pivot type input comprises at least one of a full circle pivot, an arc pivot, a bender pivot, or a corner pivot.

4. The computing device as recited in claim 1, wherein the one or more modules are configured to cause the processor to receive a well placemark command for positioning a representation of a well associated with the first center pivot irrigation system.

5. The computing device as recited in claim 1, wherein the one or more modules are configured to cause the processor to cause display of one or more discernible lines to indicate a crop height exceeds an irrigation span clearance of the irrigation system.

6. A method implemented on a computing device having a processor coupled to a memory, and a display device coupled to the processor, and an I/O device coupled to the processor, comprising:

receiving, by the processor, a command from the IO device for placing a representation of a first center pivot irrigation system within a graphical representation of a cultivation area having a modeled terrain;

receiving, by the processor from the IO device, a representation of at least one wheel of the first center pivot irrigation system and to utilize the haversine distance formula to determine a representation of a wheel track of the at least one wheel; and determining and modeling the longitude, latitude and altitude of a connection point connecting a first modeled span of the first center pivot irrigation system to a second modeled span of the irrigation system;

receiving from the IO device a first parameter of the first center pivot irrigation system comprising the longitude and latitude of the first center pivot irrigation system within the cultivation area;

receiving from the IO device a second parameter of the first center pivot irrigation system comprising the length (d) of a first modeled span to be connected to the first center pivot irrigation system, wherein the length (d) is determined using the formula $d=d=\sqrt{(L^2-(a_1-a_0)^2)}$ where L is the determined horizontal distance to be covered by the first modeled span, $a_1$ is an initial altitude and $a_0$ is a final altitude over the length L within the modeled terrain;

receiving from the IO device a third parameter of the first center pivot irrigation system comprising a rotating slope of the modeled terrain along a rotated path of the first modeled span;

receiving from the IO device a fourth parameter of the first center pivot irrigation system comprising a first bearing; and receiving from the IO device a fifth parameter of the first center pivot irrigation system comprising an adjusted bearing, wherein the adjusted bearing is determined based on the first bearing and a determined change of altitude over a sampled length of the modeled terrain;

modeling, using the processor, operation of the center pivot irrigation system based upon the one or more parameters by repeatedly incrementing the bearing through a plurality of degrees in a circle and finding a plurality of points of the span until a resulting model of the center pivot irrigation system is obtained for the wheel tracks and overhang length and spray length for each of the spans;

displaying the resulting model of the first center pivot irrigation system with colored lines on the modeled terrain with the display device representing the wheel track of the at least one wheel in a first color and the overhang length in a second color and spray length in a third color.

7. The method as recited in claim 6, further comprising receiving a pivot type input of the first center pivot irrigation system.

8. The method as recited in claim 7, wherein the pivot type input comprises at least one of at least one of a full circle pivot, an arc pivot, a bender pivot, or a corner pivot.

9. The method as recited in claim 6, further comprising receiving a well placemark command for positioning a representation of a well associated with the first center pivot irrigation system.

10. The method as recited in claim 6, causing display of one or more discernible lines to indicate a crop height exceeds an irrigation span clearance of the irrigation system.

11. A non-transitory computer-readable medium embodying a program executable in at least one computing device, the computing device having a processor coupled to the memory, and a display device coupled to the processor, and a I/O device coupled to the processor, the program comprising:

code to receive a command from the I/O device for placing a representation of a first center pivot irrigation system within a graphical representation of a cultivation area displayed on the display device having a modeled terrain;

code to receive, by a processor, a command from an IO device for placing a representation of a first center pivot irrigation system within a graphical representation of a cultivation area having a modeled terrain;

code to receive, by the processor from the computer IO device, a representation of at least one wheel of the first center pivot irrigation system;

code to utilize the haversine distance formula to determine a representation of a wheel track of the at least one wheel; and code to cause the processor to determine and model the longitude, latitude and altitude of a connection point connecting a first modeled span of the first center pivot irrigation system to a second modeled span of the irrigation system;

code to receive from the IO device a first parameter of the first center pivot irrigation system comprising the longitude and latitude of the first center pivot irrigation system within the cultivation area;

code to receive from the IO device a second parameter of the first center pivot irrigation system comprising the length (d) of a first modeled span to be connected to the first center pivot irrigation system, wherein the length (d) is determined using the formula $d=d=\sqrt{(L^2-(a_1-a_0)^2)}$ where L is the determined horizontal distance to be covered by the first modeled span, $a_1$ is an initial altitude and $a_0$ is a final altitude over the length L within the modeled terrain;

code to receive from the IO device a third parameter of the first center pivot irrigation system comprising a rotating slope of the modeled terrain along a rotated path of the first modeled span;

code to receive from the IO device a fourth parameter of the first center pivot irrigation system comprising a first bearing; and code to receive from the IO device a fifth parameter of the first center pivot irrigation system comprising an adjusted bearing, wherein the adjusted bearing is determined based on the first bearing and a determined change of altitude over a sampled length of the modeled terrain;

code to model, using the processor, operation of the center pivot irrigation system based upon the one or more parameters by repeatedly incrementing the bearing through a plurality of degrees in a circle and finding a plurality of points of the span until a resulting model of the center pivot irrigation system is obtained for the wheel tracks and overhang length and spray length for each of the spans;

code to display the resulting model of the first center pivot irrigation system with colored lines on the modeled terrain with the display device representing the wheel track of the at least one wheel in a first color and the overhang length in a second color and spray length in a third color.

12. The non-transitory computer-readable medium as recited in claim 11, wherein the program further comprises: code to receive a pivot type input, of the first center pivot irrigation system.

13. The non-transitory computer-readable medium as recited in claim 12, wherein the pivot type input comprises at least one of at least one of a full circle pivot, an arc pivot, a bender pivot, or a corner pivot.

14. The non-transitory computer-readable medium as recited in claim 11, wherein the program further comprises: code to receive a well placemark command for positioning a representation of a well associated with the first center pivot irrigation system.

* * * * *